United States Patent [19]

Han et al.

[11] Patent Number: 5,474,951
[45] Date of Patent: Dec. 12, 1995

[54] METHOD FOR MAKING A CHARGE STORAGE ELECTRODE FOR A SEMICONDUCTOR DEVICE

[75] Inventors: Jin S. Han, Kwangmyeongsi; Jae K. Kim, Ichoneub; Ei S. Jeong, Changjeonri, all of Rep. of Korea

[73] Assignee: Hyundai Electronics Industries Co., Ltd., Rep. of Korea

[21] Appl. No.: 424,579

[22] Filed: Apr. 17, 1995

Related U.S. Application Data

[63] Continuation of Ser. No. 141,482, Oct. 22, 1993, abandoned.

[30] Foreign Application Priority Data

Oct. 24, 1992 [KR] Rep. of Korea ............... 1992-19679

[51] Int. Cl.[6] ........................ H01L 21/70; H01L 27/00
[52] U.S. Cl. ................. 437/60; 437/919; 156/649.1; 216/6; 216/11
[58] Field of Search ..................... 437/47, 52, 60, 437/919; 156/649.1; 216/46, 11, 6, 72

[56] References Cited

U.S. PATENT DOCUMENTS 4,943,719  7/1990  Akamine et al. ............... 216/11
5,219,780  6/1993  Jun ............................... 437/52

Primary Examiner—Olik Chaudhuri
Assistant Examiner—H. Jey Tsai
Attorney, Agent, or Firm—Merchant, Gould, Smith, Edell, Welter & Schmidt

[57] ABSTRACT

A method for making of a charge storage electrode in a semiconductor device is disclosed.

The method comprises the steps of forming a first silicon film into a second protruded silicon film which is aslant at its both sides, forming a first thin insulating film over the second silicon film, and applying an anisotropic dry etching to the first insulating film and the second silicon film to form a vertical structure of a third silicon film, said anisotropic dry etching allowing the upper first insulating film to be removed prior to the side first insulating film, which subsequently remains in a thinner thickness to act as an obstacle to the anisotropic dry etching for the side portions of the protruded second silicon film, so that the central portion of the protruded second silicon film is etched in a larger quantity than the side portions.

The silicon film which is an electroconductive material for a charge storage electrode is structured to be vertical in accordance with the present invention, so that it comes to have a larger surface area than a conventional one, thereby securing the capacitance of the charge storage electrode and making the charge storage electrode in an improved production efficiency.

7 Claims, 9 Drawing Sheets

METHOD FOR MAKING A CHARGE STORAGE ELECTRODE FOR A SEMICONDUCTOR DEVICE

"This is a Continuation of application Ser. No. 08/141,482, filed Oct. 22, 1993, now abandoned."

BACKGROUND OF THE INVENTION

1. Field of the invention

The present invention relates in general to a method for making of a charge storage electrode of a capacitor in a high integrated semiconductor, and more particularly to a method capable of maximizing the surface area of the electrode.

2. Description of the Prior Art

In general, since the area of unit cell is decreased as integration degree is increased in a semi conductor memory device, a capacitor, which stores information comes to a limit in a view of capacity.

In an effort to overcome the limit, various stack structures have been developed. The further increase of integration degree, however, makes a conventional monolayer arrangement in the stack structure useless. For solving the problems, a multilayer arrangement has appeared.

However, the multi layer arrangement requires a more complicated process, which leaves, in turn, a problem such as low production efficiency and the like.

SUMMARY OF THE INVENTION

Therefore an object of the present invention is to solve the aforementioned problems encountered in the prior arts and to provide a method for making of a charge storage electrode, capable of remarkably increasing the surface area of the storage electrode in the same cell area, as compared with a conventional one, in which a thin insulating layer such as a natural generated oxide film is employed to change the conventional structure of storage electrode into a novel, vertical structure.

In accordance with the present invention, this object can be accomplished by providing a method for making of a charge storage electrode which comprises the steps of: forming a first silicon film into a second protruded silicon film which is aslant at its both sides: forming a first thin insulating film over the second silicon film; and applying an anisotropic dry etching to the first insulating film and the second silicon film to form a vertical structure of a third silicon film, said anisotropic dry etching forcing the upper surface of said first insulating film to be removed prior to the side surfaces of said first insulating film, which subsequently remains in a thinner thickness to act as an obstacle to said anisotropic dry etching for the side portions of said protruded second silicon film, so that the central portion of said protruded second silicon film is etched in a larger quantity than the side portions.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE INVENTION

Hereinafter, preferred embodiments of the invention will be described in detail with reference to the drawings.

Referring initially to FIGS. 1A–K, there are schematic step diagrams illustrating a method for making a charge storage electrode according to a first embodiment of the invention.

Figure 1A:
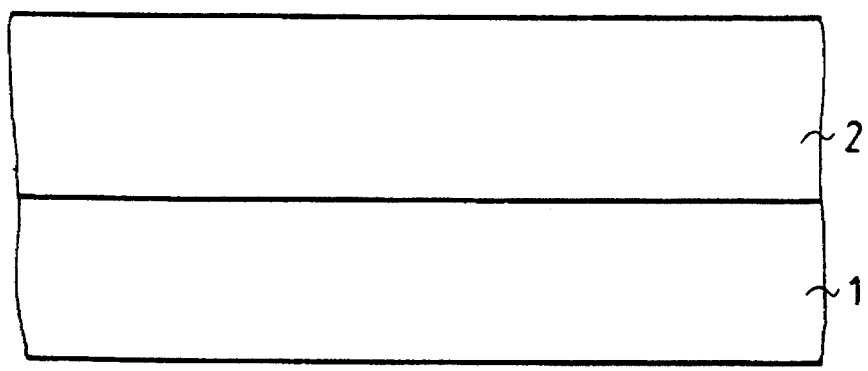
FIGS. 1A to 1C show a processing flow illustrating a method for making a charge storage electrode according to a first embodiment.

As shown in FIG. 1A, over an insulating material 1 is formed a silicon film 2.

Figure 1B:
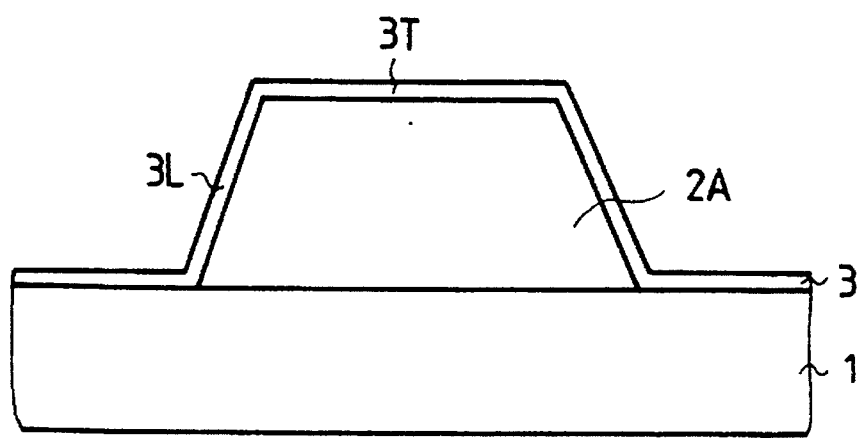

Subsequently, an etch process is undertaken to give a slope to the silicon film 2. As a result of the slope etching, the silicon film 2 is formed into a protruded form 2A as shown in FIG. 1B. Over the protruded silicon film 2A, a nitride film or thin oxide film 3 is deposited. As the thin oxide film, there may be used an oxide film (not shown) which may be generated naturally on the surface of the protruded silicon film 2A.

Figure 1C:
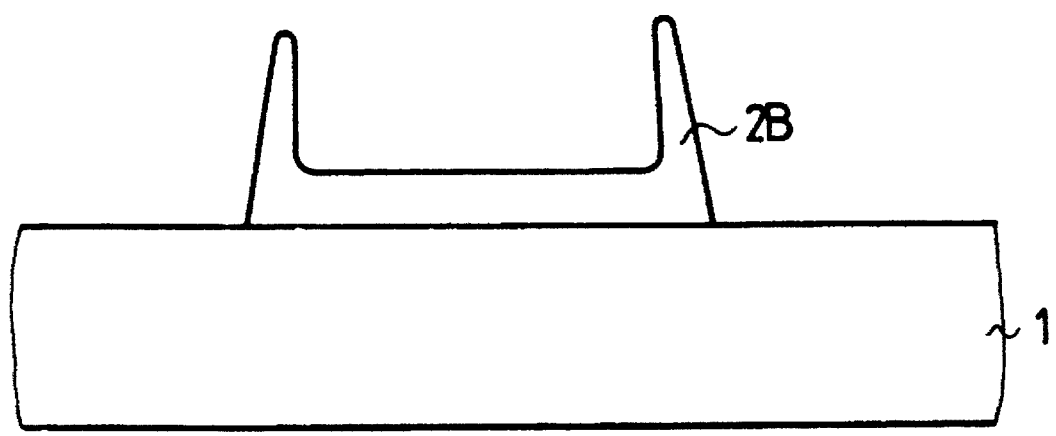

An anisotropic dry etching in which the etching selection ratio of a silicon film and an oxide film is approximately 10:1 is applied to the resulting structure to form a vertical structure of silicon film 2B, as shown in FIG. 1C. At this time, in FIG. 1B, a thin oxide film 3T on the upper surface of the protruded silicon film 2A is vertically thinner than a thin oxide film 3L on the side surface of the protruded silicon film 2A, so that the film 3T is removed prior to the film 3L when they are subjected to a dry etching. In other words, the side thin oxide film 3L remains in a thinner thickness even though the upper thin oxide film 3T is etched completely. Therefore, the anisotropic dry etching allows the central portion Of the protruded silicon film 2A to be etched in a large quantity whereas the opposite side portions are etched in a small quantity, since the anisotropic dry etching has an etching selection ratio of 10:1 for the silicon film and the remaining oxide film. As a result, the silicon film 2A of FIG. 1B is etched to be formed into the vertical structure of the silicon film 2B of FIG. 1C, which has the result of an increase in a surface area.

Figure 2:
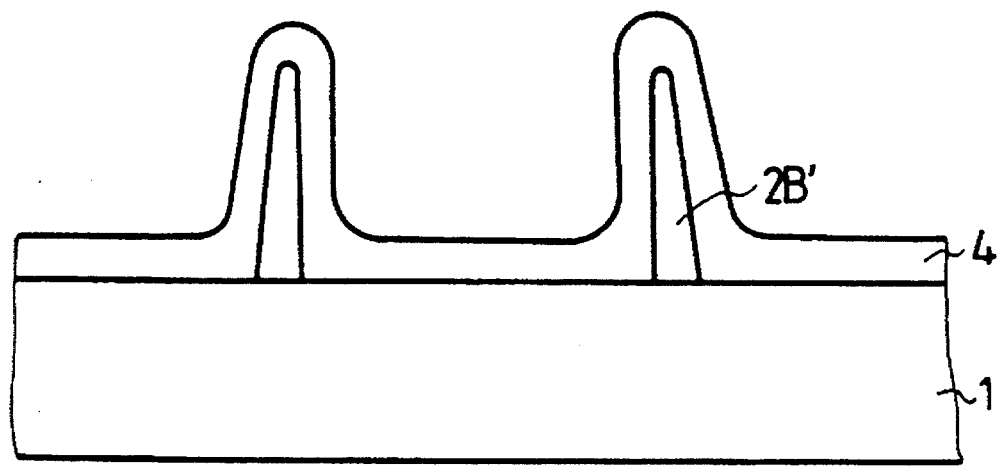
FIG. 2 is a sectional view illustrating a method for making of a charge storage electrode according to a second embodiment.

Referring now to FIG. 2, there is a schematic sectional view illustrating a pair of vertical, spaced-apart silicon films. In this FIG., a pair of vertical, spaced-apart silicon films 2B' are formed from the silicon film 2A of FIG. 1B, which will is subjected to the anisotropic dry etching of 10:1 selection ratio for the silicon film and the oxide film until the insulating material 1 has been exposed thereby. Following the formation of the vertical, spaced-apart silicon films 2B', a silicon film is deposited entirely over the resulting wafer structure so as to electrically connect the spaced-apart silicon films 2B' to each other. As shown in FIG. 2, this resulting silicon has a kind of vertical structure like that of the first embodiment, so that the surface area of silicon film is enlarged.

Turning now to FIGS. 3A–3D, these drawings show schematic sectional views illustrating processing steps, respectively.

Figure 3A:
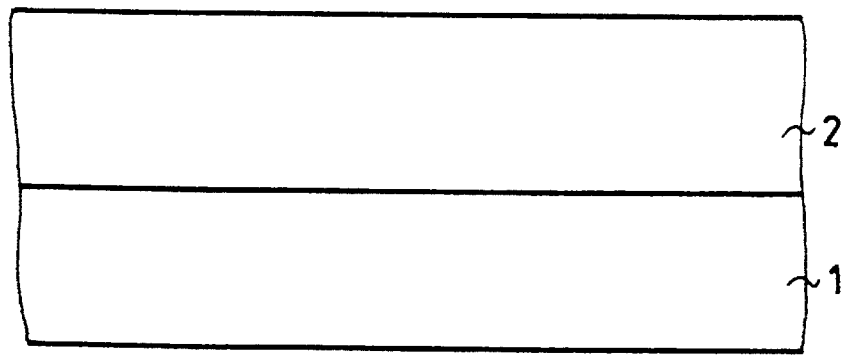
FIGS. 3A to 3D show a processing flow illustrating a method for making a charge storage electrode according to a third embodiment.

A third embodiment of the present invention is formed of an insulating material 1. As shown in FIG. 3A, over the insulating material 1, a silicon film 2 is formed in a manner similar to that in the first embodiment.

Figure 3B:
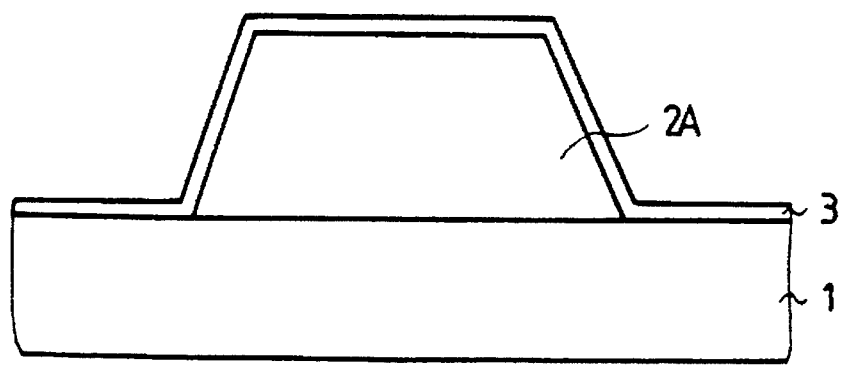

For the purpose of enlarging the surface area, the silicon film 2 of FIG. 3A is first etched aslant to a protruded silicon film 2A, followed by making an oxide film 3 or nitride film over the protruded silicon film 2A as shown in FIG. 3B. Instead of making an oxide film or nitride film, an oxide film may be generated naturally on the protruded film 2A.

Figure 3C:
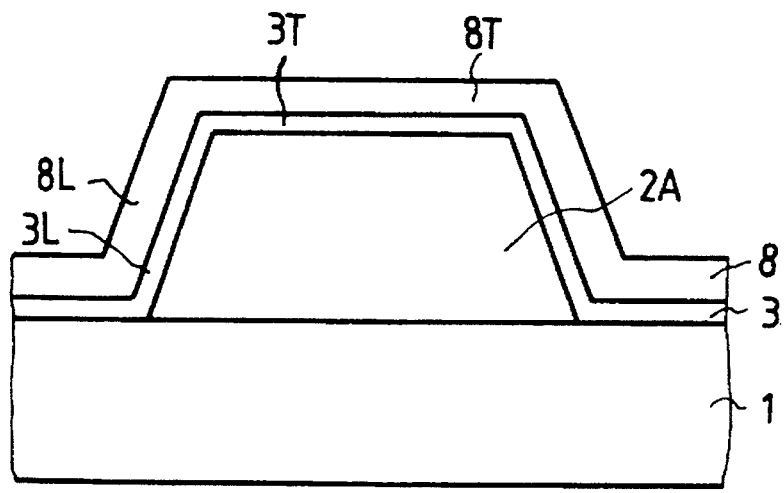

Subsequently, over the thin oxide film 3 is formed a silicon film 8, as shown in FIG. 3C.

Figure 3D:
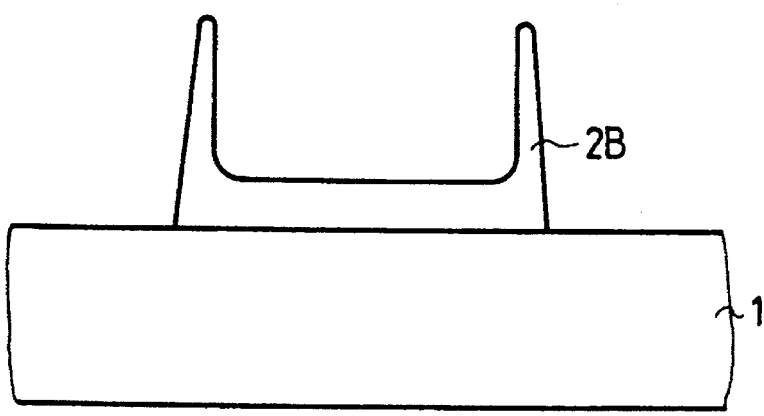

An anisotropic dry etching in which the etching selection ratio for a silicon film and an oxide film is approximately 10:1, respectively, is applied to the silicon film 8, the thin oxide film 3 and the silicon film 2A in due order to form a vertical structure of silicon film 2B which is similar to that of FIG. 1C, as shown in FIG. 3D. At this time, in FIG. 3C, a silicon film 8T and a thin oxide film 3T on the upper surface of the protruded silicon film 2A are vertically thinner than a silicon film 8L and a thin oxide film 3L on the side surface of the protruded silicon film 2A, respectively, so that the silicon film 8T and the thin oxide film 3T are removed prior to the corresponding side films 8L and 3L when they are subjected to a dry etching. In other words, the side silicon film 8L and the side thin oxide film 3L remain in a thinner thickness even though the upper silicon film 8T and the upper thin oxide film 3T are etched completely. Therefore, the anisotropic dry etching allows the central portion of the protruded silicon film 2A to be etched in a large quantity whereas the opposite side portions are etched in a small quantity, since the anisotropic dry etching has an etching selection ratio of 10:1 for the silicon film and the remaining oxide film. As a result, the silicon film 2A of FIG. 3C is etched to be formed into the vertical structure of the silicon film 2B of FIG. 3D, which has the result of an increase in a surface area.

Figure 4:
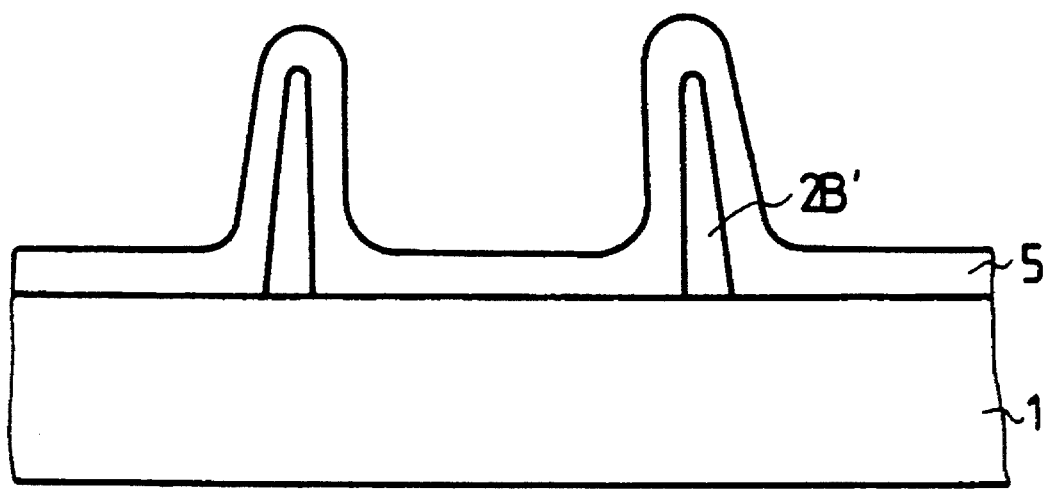
FIG. 4 is a sectional views illustrating a method for making a charge storage electrode according to a fourth embodiment.

A fourth preferred embodiment of the invention is explained with reference to FIG. 4. This FIG. shows an illustration of a pair of vertical, spaced-apart silicon films. In this FIG., a pair of vertical, spaced-apart silicon films 2B' are formed from the sit icon film 2A of FIG. 3C, which is subjected to the anisotropic dry etching of 10:1 selection ratio for the silicon film and the oxide film until the insulating material 1 has been exposed thereby. Following the formation of the vertical, spaced-apart silicon films 2B', a silicon film is deposited entirely over the resulting wafer structure so as to electrically connect the spaced-apart silicon films 2B', each other.

Process steps according to a fifth preferred embodiment of the present invention will be in detail described with reference with the corresponding views of FIGS. 5A–E.

Figure 5A:
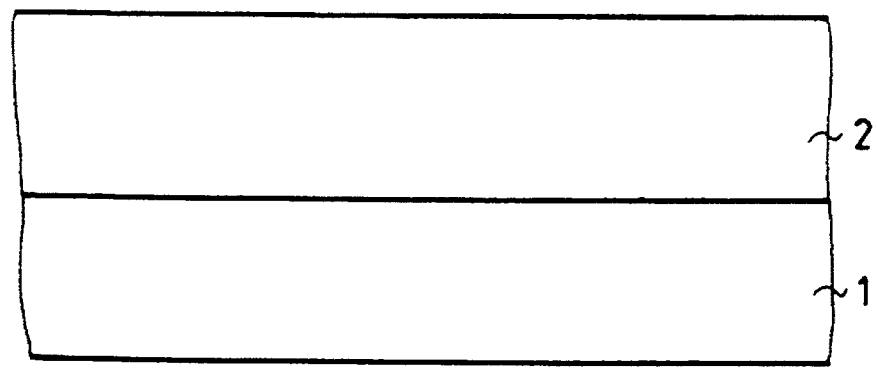
FIGS. 5A to 5E show a processing flow illustrating a method for making of a charge storage electrode according to a fifth embodiment.

First, in FIG. 5A, there is a sectional view showing an insulating material 1 on which a silicon film 2 is formed.

Figure 5B:
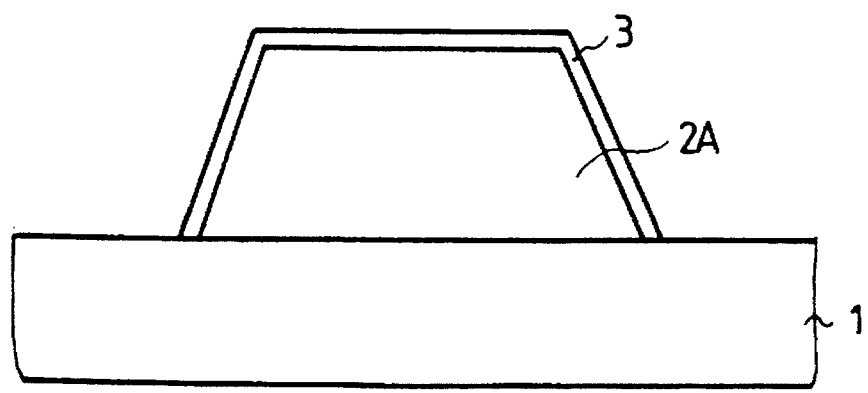

The silicon film 2 is formed on the insulating material 1, as shown in FIG. 5A, and an etch process is undertaken to give a slope to the silicon film 2, so that the silicon film 2 is formed into a protruded form 2A as shown in FIG. 5B. An oxide film 3 is formed naturally on the protruded silicon film 2A.

Figure 5C:
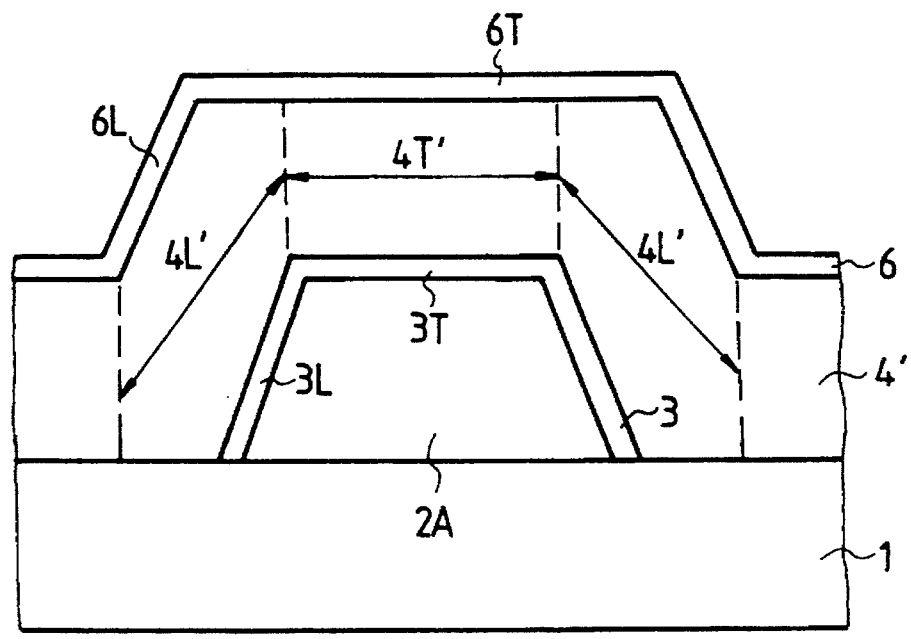
Figure 5D:
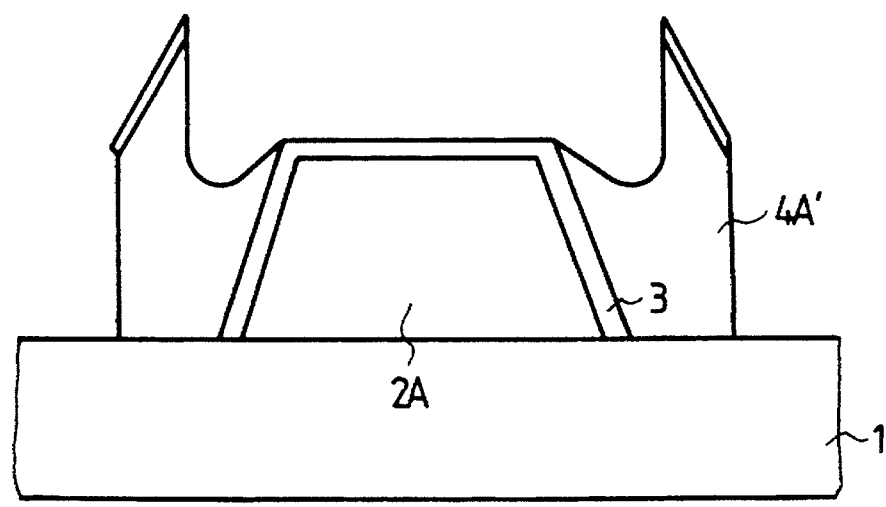

Subsequently, over the thin, naturally formed oxide film 3 there is deposited a silicon film 4' which is thicker than the silicon film 8 of the third embodiment and then, a thin insulating film 6 which consists of an oxide film is deposited over the silicon film 4'. As shown in FIG. 5C, the resulting structure has the sectional view showing a protruded form.

Next, the thin insulating film 6 and the silicon film 4' are etched in a respective constant thickness in due order by using an anisotropic dry etching in which the etching selection ratio for a silicon film and an oxide film is approximately 10:1 until the thin, naturally formed oxide film 3 is exposed, so that a vertical structure of silicon film 4A' is formed, as shown in FIG. 5C. At this time, in FIG. 5D, an upper thin oxide film 6T and a upper silicon film 4T' consisting of the protruded forms are vertically thinner than a side thin oxide film 6L and a side silicon film 4L', respectively, so that the upper thin oxide film 6T and the upper silicon film 4T' are removed prior to the side thin oxide film 6L and the side silicon film 4L' when they are subjected to the dry etching. In addition, since the dry etching selection ratio has a large relative difference, a vertical structure of silicon film 4A' is formed at last.

Figure 5E:
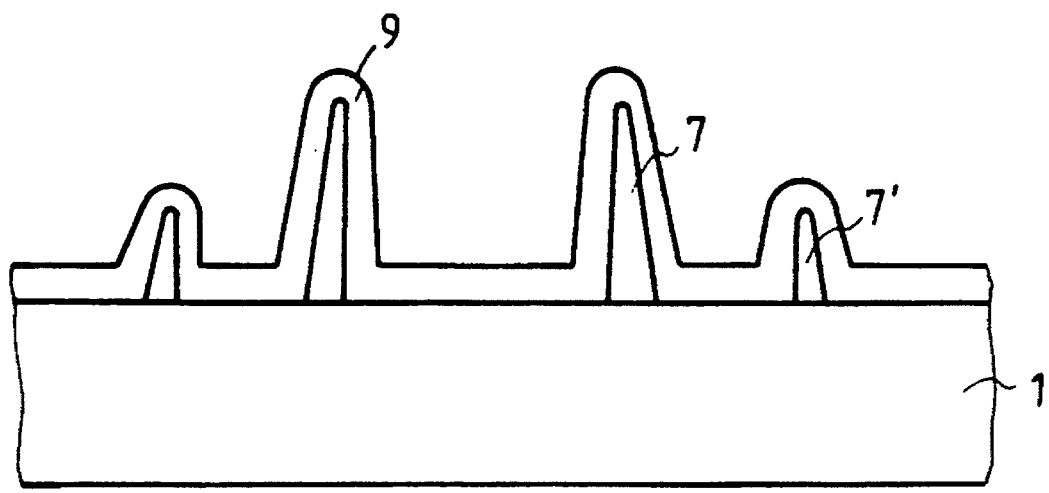

Finally, an anisotropic dry etching in which the etching selection ratio for a silicon film and an oxide film is between approximately 10:1 to 40:1 is applied to the resulting structure to form a double vertical structure consisting of a pair of spaced-apart silicon films 7 and a pair of spaced-apart silicon films 7', as shown in FIG. 5E. A silicon film is deposited on the resulting double structure so as to electrically connect the vertical, spaced-apart silicon films 7 and 7' to one another. As a result, there is obtained a silicon layer 9 which is enlarged in a surface area.

As described above, the silicon film which is an electroconductive material for a charge storage electrode is structured to be vertical in accordance with the present invention, so that it comes to have a larger surface area than a conventional one, thereby securing the capacitance of the charge storage electrode and making the charge storage electrode with an improved production efficiency.

What is claimed is:

1. A method for making a vertical charge storage electrode, comprising the steps of:

forming a first silicon film into a second protruded silicon film having a side with a slant, said second protruded silicon film also having an exposed surface;

forming a first insulating film over said surface of said second protruded silicon film; and applying an anisotropic dry etching to said first insulating film and said second protruded silicon film, said anisotropic dry etching having a selective etching ratio for said second protruded silicon film and said first insulating film, said second protruded film thereby being formed as vertical silicon films.

2. A method according to claim 1, further comprising the step of:

depositing a third silicon film over said first insulating film to increase surface area of said vertical charge storage electrode.

3. A method according to claim 1, wherein said first insulating film is an oxide film and wherein said anisotropic dry etching has a selective etching ratio of approximately 10:1 for the silicon film and the oxide film.

4. A method according to claim 1, further comprising the steps of:

forming, in order, a fourth silicon film and a second insulating film over said first insulating film before applying said anisotropic dry etching, said second protruded film and said fourth silicon film forming vertical silicon films.

5. A method according to claim 4, wherein said second insulating film is one a native oxide film and a nitride film.

6. A method according to claim 1, further comprising the step of:

depositing a fifth silicon film after applying the anisotropic dry etching to electrically connect said vertical silicon films to each other.

7. A method according to claim 4, further comprising the step of:

depositing a fifth silicon film after applying the anisotropic dry etching to electrically connect said vertical silicon films to each other.

* * * * *